(12) United States Patent
Lavoie et al.

(10) Patent No.: US 7,923,838 B2
(45) Date of Patent: Apr. 12, 2011

(54) METHOD AND STRUCTURE FOR REDUCING CONTACT RESISTANCE BETWEEN SILICIDE CONTACT AND OVERLYING METALLIZATION

(75) Inventors: Christian Lavoie, Ossining, NY (US); Conal E. Murray, Yorktown Heights, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 12/122,984

(22) Filed: May 19, 2008

(65) Prior Publication Data
US 2008/0211100 A1    Sep. 4, 2008

Related U.S. Application Data

(63) Continuation of application No. 11/440,202, filed on May 24, 2006, now Pat. No. 7,491,643.

(51) Int. Cl.
*H01L 21/4763* (2006.01)
(52) U.S. Cl. .............. 257/751; 257/762; 257/E21.165
(58) Field of Classification Search ............... 257/762, 257/751
See application file for complete search history.

(56) References Cited

U.S. PATENT DOCUMENTS

| | | | |
|---|---|---|---|
| 5,700,722 A | 12/1997 | Sumi | |
| 5,801,444 A * | 9/1998 | Aboelfotoh et al. | 257/762 |
| 6,015,749 A * | 1/2000 | Liu et al. | 438/628 |
| 6,534,390 B1 | 3/2003 | Chong et al. | |
| 6,544,888 B2 | 4/2003 | Lee | |
| 6,599,831 B1 | 7/2003 | Maszara et al. | |
| 6,884,736 B2 * | 4/2005 | Wu et al. | 438/740 |
| 2001/0024868 A1 | 9/2001 | Nagel et al. | |
| 2004/0245635 A1 | 12/2004 | Lee et al. | |
| 2005/0014360 A1 | 1/2005 | Yu et al. | |

OTHER PUBLICATIONS

Iijima, T. et al., "A Novel Selective $Ni_3Si$ Contact Plug Technique for Deep-Submicron ULSIs." 1992 Symposium on VLSI Technology Digest of Technical Papers, IEEE (1992).

Klein, J. et al., "Characteristics of a Poly-Silicon Contact Plug Technology." VMIC Conference, IEEE (1989).

* cited by examiner

*Primary Examiner* — Alexander G Ghyka
(74) *Attorney, Agent, or Firm* — Scully, Scott, Murphy & Presser; Louis J. Percello, Esq.

(57) ABSTRACT

A semiconductor structure in which the contact resistance in the contact opening is reduced as well as a method of forming the same are provided. This is achieved in the present invention by replacing conventional contact metallurgy, such as tungsten, or a metal silicide, such as Ni silicide or Cu silicide, with a metal germanide-containing contact material. The term "metal germanide-containing" is used in the present application to denote a pure metal germanide (i.e., MGe alloy) or a metal germanide that includes Si (i.e., MSiGe alloy).

6 Claims, 2 Drawing Sheets

METHOD AND STRUCTURE FOR REDUCING CONTACT RESISTANCE BETWEEN SILICIDE CONTACT AND OVERLYING METALLIZATION

RELATED APPLICATION

This application is a continuation of U.S. patent application Ser. No. 11/440,202, filed May 24, 2006.

FIELD OF THE INVENTION

The present invention relates to a semiconductor structure and a method of fabricating the same. More particularly, the present invention relates to a semiconductor structure in which the contact resistance in the contact opening, typically between the silicide contact and the overlying metallization, is reduced. The present invention also relates to a method of fabricating such a semiconductor structure.

BACKGROUND OF THE INVENTION

In order to meet the ever increasing demand for increased device density and performance, a semiconductor technology consisting of a low-k dielectric material (dielectric constant less than silicon dioxide) and an interconnection wiring of copper metallurgy, defined by a double damascene method, is the present day choice for the back end of line (BEOL). Because, dry air has the theoretically lowest dielectric constant of one (1), most low-k materials such as aerogels, hydrogen silsesquioxane (HSQ), fluorinated organic polymers, and organosilicate glass (e.g., SiCOH) are deposited by chemical vapor deposition (CVD). The choice of barrier layers includes tantalum, tungsten and titanium-based alloys.

The high performance interconnection is formed with wirings of high conductivity metallurgies on different levels, insulated from each other with layers of dielectric material and interconnected at desired points. In order to prevent, or to reduce, the corrosive impurity ingression into interconnection wiring structure, at least one layer of the top most layer of interconnection wiring is imbedded in one or more layers of previous standard insulators such as silicon oxide deposited by plasma enhanced chemical vapor deposition (PECVD) using silane ($SiH_4$) or tetraethylorthosilicate (TEOS) precursors. Accordingly, the present day high performance interconnection is comprised of one or more layers of high conductivity copper interconnections, imbedded in the low-k dielectric SiCOH, and bounded on top and bottom by much denser layers of PECVD oxide and BPSG, respectively.

The front end of line (FEOL) corresponds to the levels used to fabricate the transistors, which are composed of silicon from a bulk silicon or silicon-on-insulator (SOI) wafer, high-k dielectric silicon nitride features for electrical insulation and polysilicon gate materials above the transistors in a complementary metal-oxide semiconductor (CMOS) geometry. The corresponding contacts to the source, gate and drain regions of the CMOS transistors often employ a self-aligned silicide (SALICIDE) material, in which a thin metal layer is deposited onto the silicon and annealed to form a metal silicide. Nickel represents the material of choice for current silicide contacts, which possesses a bulk resistivity of approximately 15 to 20 $\mu\Omega$-cm.

The speed of high-performance semiconductor microcircuitry strongly depends on the overall resistance through the device and interconnect metallization. As the dimensions of the semiconductor features within existing and future generations of microprocessors decrease, the resistance of many of the constituent structures of the semiconductor device increases. For example, the resistance of the vias, which connect the first level of BEOL metallization to the source and drain regions of the transistors (FEOL), is expected to increase as the square of the scaling factor due to electron scattering at small dimensions.

Three major components of the total via (i.e., contact opening) resistance are the bulk resistivity of the via and barrier layer materials, the contact resistance at the bottom via interface and the contact resistance at the top via interface. Current semiconductor manufacturing employs tungsten as the via material and titanium-based barrier layers. Although tungsten possesses a low bulk resistivity (5.5 $\mu\Omega$-cm), the bulk via resistance is also affected by the presence of voids or seams within the via, a problem that becomes more prevalent as via holes become more difficult to fill using conventional deposition techniques, such as chemical vapor deposition (CVD). However, the contact resistance at the bottom via interface, between the barrier layer and an underlying silicide material formed on top of the source and drain regions, represents an increasing fraction of the total via resistance.

This problem represents a significant impact on the performance and development of semiconductor technology. A method is sought to reduce the effects of contact resistance at the interface between the lowest BEOL via and the underlying silicide layers.

T. Iijima, et al. "A novel selective $Ni_3Si$ contact material technique for deep-submicron ULSIs", 1992 Symposium on VLSI Technology Digest of Technical Papers, IEEE, pages 70-71 discloses a $Ni_3Si$ contact material that is said to have a low contact resistance. The $Ni_3Si$ contact material is made by first providing a contact opening in a silicon dioxide layer. After providing the contact opening, a TiN/Ti film is deposited. The TiN/Ti film serves as an adhesion/silicidation stop layer. Undoped polySi is then deposited into the contact opening and thereafter a layer of Ni is formed. The Ni silicide contact material is then formed by annealing at 600° C. in argon for one minute. One problem with this prior art approach is that the Ni silicide is formed at a relatively high temperature which may adversely affect the device previously fabricated.

U.S. Pat. No. 5,700,722 to Sumi discloses another approach for forming a silicide contact material. In this prior art approach, a contact opening is first formed in an interlayer insulating layer. A single layer of a Si based material is then deposited, followed by a metal layer. The metal layer consists of Zr, Ni, Pd, Cu, Au, or Ag. After deposition of the metal layer, the structure is heated to a temperature at which the Si based material reacts with the metal to form a silicide material within the contact opening. In the '722 patent, a silicidation temperature of 600° C. is also mentioned.

If view of the above, there is still a need for providing a new material for the contact material as well as method of forming the same. The new material so provided would lower the contact resistance in the contact opening. Additionally, it would also be desirable to provide a method of fabricating a contact material in which the thermal budget used in forming the same is lower than that used in fabricating prior art silicide contact materials.

SUMMARY OF THE INVENTION

The present invention provides a semiconductor structure in which the contact resistance in the contact opening is reduced. This is achieved in the present invention by replacing conventional contact metallurgy, such as tungsten, or a metal silicide, such as Ni silicide or Cu silicide, with a metal germanide-containing contact material. The term "metal germanide-containing" is used in the present application to denote a pure metal germanide (i.e., MGe alloy) or a metal germanide that includes Si (i.e., MSiGe alloy).

That is, the applicants of the present application have determined that the contact resistance in the contact opening (i.e., via), typically between the contact regions and overlying metallization, can be reduced by providing a metal germanide-containing contact material in the contact opening of an insulating interlayer. The metal germanide-containing contact materials of the present application have a lower sheet resistance as compared to the equivalent metal silicide contact material. For example, the metal germanide-containing contact material of the present application has a sheet resistance value of about 6 $\mu\Omega$-cm or less, while the equivalent metal silicide contact material has a sheet resistance of about 40 $\mu\Omega$-cm or greater.

In accordance with one embodiment of the present invention, the metal germanide-containing contact material is spaced apart from the underlying silicide contact by a diffusion barrier. In yet another embodiment of the present application, the inventive metal germanide-containing contact material is in direct contact with the underlying silicide contact. In either embodiment of the present invention, the silicide contact may be present on the source/drain and/or gate regions of a field effect transistor.

It is noted that the metal germanide-containing contact material of the present invention contains no unreacted metal or Ge-containing material after performing an annealing process that causes reaction between a metal and a Ge-containing material.

The choice of metal used in forming the inventive metal germanide-containing contact material can be tailored to minimize contact resistance to the adjacent levels. Although bulk resistivity of the germanide in the preferred embodiment of the present application will be in the range from about 5 to about 15 $\mu\Omega$-cm, the contact resistance is expected to dominate the total via resistance. A via material (i.e., contact material) with a low Schottky barrier (less than 0.4 eV) such as that obtained using a germanide material can drop the contact resistance by an order of magnitude.

In general terms, the present invention provides a semiconductor structure comprising:

a semiconductor substrate including at least one field effect transistor disposed thereon, said semiconductor substrate including silicide contact regions located adjacent said at least one field effect transistor;

an insulating interlayer located on said semiconductor substrate and extending atop said at least one field effect transistor, said insulating interlayer having contact openings exposing said silicide contact regions; and a metal germanide-containing contact material within said contact openings.

In accordance with one embodiment of the present invention, the metal germanide-containing contact material is spaced apart from the underlying silicide contact by a diffusion barrier. In yet another embodiment of the present application, the inventive metal germanide-containing contact material is in direct contact with the underlying silicide contact. In either embodiment of the present invention, the suicide contact may be present on the source/drain and/or gate regions of a field effect transistor.

In another embodiment of the present invention, the semiconductor structure comprises:

a semiconductor substrate including at least one field effect transistor disposed thereon;

an insulating interlayer located on said semiconductor substrate and extending atop said at least one field effect transistor, said insulating interlayer having contact openings; and a continuous metal germanide-containing material within said contact openings, said continuous metal germanide-containing material having a lower portion serving as a device contact and an upper portion serving as a contact to overlying metallization.

The present invention also provides a method of fabricating the above mentioned semiconductor structures. In general terms, the method used in forming the aforementioned semiconductor structures including the metal germanide-containing contact material comprises:

providing a semiconductor substrate including at least one field effect transistor disposed thereon;

forming an insulating interlayer located on said semiconductor substrate and extending atop said at least one field effect transistor, said insulating interlayer having contact openings; and forming a metal germanide-containing contact material within said contact openings.

In accordance with the method of the present invention, the forming the metal germanide-containing contact material comprises depositing, in any order, a metal layer and a Ge-containing layer, annealing to cause reaction between the metal layer and the Ge-containing layer, and removing any unreacted material.

In some embodiments of the inventive method, a diffusion barrier is formed at least within the opening in the insulating interlayer prior to forming the metal germanide-containing contact material. In such an embodiment, the resultant metal germanide-containing contact material is spaced apart from underlying silicide contacts that are located on the source/drain regions and, optionally, the gate region of the structure. In yet another embodiment of the present application, the inventive metal germanide-containing contact material is in direct contact with underlying silicide contact regions. In any of these embodiments of the present invention, the silicide contact may be present in the source/drain and/or gate regions of a field effect transistor. In yet another embodiment of the present application, a lower portion of the contact material serves as a contact to those regions, while the upper portion of the contact material serves as contact to the overlying metallization.

In addition to the above method, which is used in forming a semiconductor structure including a metal germanide-containing contact material, the present invention also provides a method of forming a structure which includes either a metal germanide-containing contact material or a metal silicide contact material. It is noted that the inventive method utilizes a lower silicide/germanide formation temperature than prior art processes and, as such, lowers the thermal budget.

In general terms, this method of the present invention comprises:

providing a semiconductor substrate including at least one field effect transistor disposed thereon, said semiconductor substrate including silicide contact regions located adjacent said at least one field effect transistor;

forming an insulating interlayer located on said semiconductor substrate and extending atop said at least one field effect transistor, said insulating interlayer having contact openings exposing said silicide contact regions; and forming a metal silicide or metal germanide-containing contact material within said contact openings, wherein said forming said contact material includes a step of annealing to a temperature of about 400° C. or less.

DETAILED DESCRIPTION OF THE INVENTION

The present invention, which provides a semiconductor structure having reduced contact resistance in a contact opening as well as a method of forming the same, will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In accordance with the present invention, a metal germanide-containing contact material is provided that reduces the contact resistance in a contact opening, typically between underlying silicide contact regions and overlying metallization. The choice of metal to form the germanide-containing contact material can be tailored to minimize contact resistance to the adjacent materials, but preferably it comprises W, Cu or Ni. The preferred contact material should possess a low Schottky barrier height, which dictates the contact resistance, to the adjacent material, and should be formed by an anneal which is lower in temperature than that used to form the underlying silicide contact regions. In conventional semiconductor device fabrication, underlying silicide contact regions are typically composed of nickel silicide or nickel alloy silicide, where the alloy can consist of platinum, palladium, rhenium, tungsten or a combination. Because the underlying silicide layer and the contact material are, in some embodiments, joined by a diffusion barrier, the composition of the diffusion barrier is selected to form low Schottky barriers to both the silicide contact regions and the metal germanide-containing contact material, while blocking any interdiffusion between these regions.

Figure 1A:
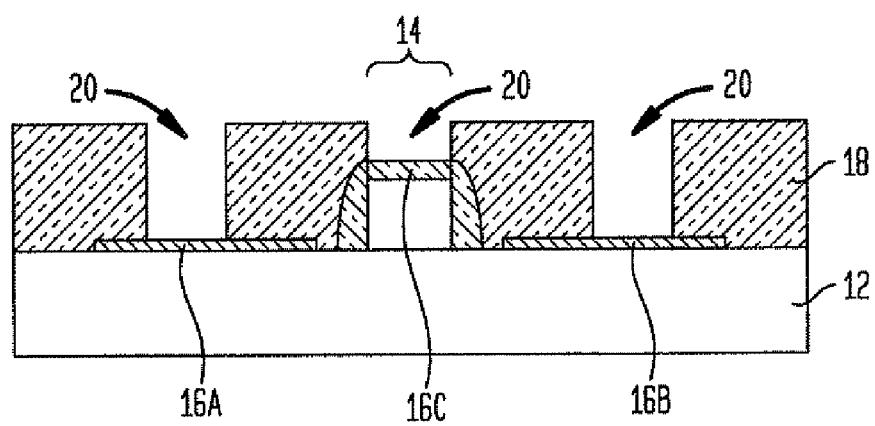
FIGS. 1A-1B are pictorial representations (through cross sectional views) illustrating the basic processing steps employed in one embodiment of the present application.
Figure 1B:
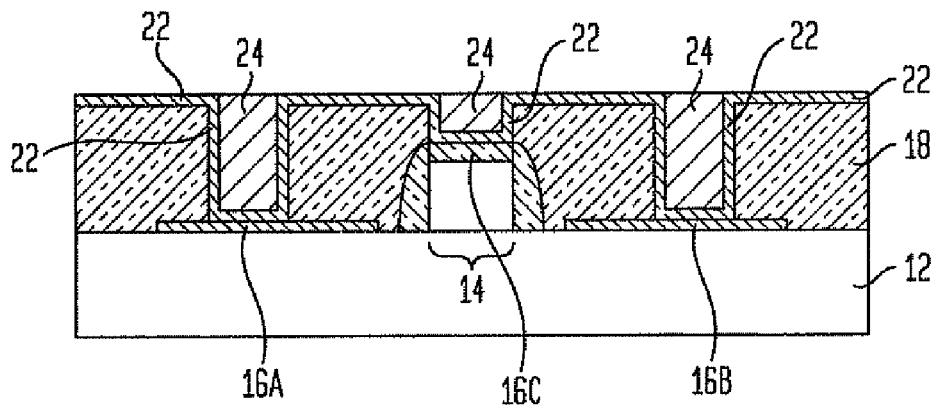

Reference is first made to FIGS. 1A-1B which illustrate the basic processing steps employed in one embodiment of the present application. In the embodiment shown in FIGS. 1A-1B, a diffusion barrier is disposed between the inventive metal germanide-containing contact material and the underlying silicide contact regions. Although a diffusion barrier is employed in this embodiment, this embodiment also contemplates the absence of the same.

Reference is first made to FIG. 1A which illustrates an initial structure 10 that is employed in the present invention. As illustrated, the initial structure 10 includes a semiconductor substrate 12 having at least one field effect transistor 14 located on a surface thereof. The initial structure 10 further includes silicide contact regions 16A, 16B and 16C. It is noted that silicide contact regions 16A and 16B are located atop the source and drain regions (not shown) of the adjacent field effect transistor 14, while silicide contact region 16C is located atop the gate conductor of the transistor. Although the initial structure 10 contemplates a silicide contact region 16C atop the gate conductor, the present invention is not limited to such an embodiment. In some embodiments of the present invention, for example, no silicide contact region is located atop the gate conductor. This is occurs when a dielectric cap is present atop the gate conductor during the silicidation process.

The initial structure 10 also includes an interlayer dielectric 18 located atop the substrate 12 as well as the field effect transistor 14. The interlayer dielectric 18 has contact openings 20 that expose a portion of each of the underlying silicide contact regions 16A-16C.

The initial structure 10 is comprised of materials that are well known to those skilled in the art. Moreover, the initial structure 10 is fabricated utilizing semiconductor processes that are also well known to those skilled in the art.

The semiconductor substrate 12 employed in the present invention comprises any semiconducting material including, but not limited to: Si, Ge, SiGe, SiC, SiGeC, Ga, GaAs, InAs, InP and all other III/V or II/VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

When SOI substrates are employed, those substrates include top and bottom semiconductor, e.g., Si, layers that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

The substrate 12 may have a single crystal orientation or alternatively hybrid semiconductor substrates having surface regions of different crystal orientations can also be employed. The hybrid substrate allows for fabricating a FET upon a specific crystal orientation that enhances the performance of the specific FET formed. For example, the hybrid substrate allows for providing a structure in which a pFET can be formed on a (110) crystal orientation, while the nFET can be formed on a (100) crystal orientation. When a hybrid substrate is used, it may have SOI-like properties, bulk-like properties or a combination of SOI- and bulk-like properties.

The field effect transistor 14 typically includes a gate dielectric and an overlying gate conductor. In the drawings of the present invention, the gate dielectric and the overlying gate conductor are shown as a single material stack for clarity.

The gate dielectric (not specifically shown) is comprised of an insulating material having a dielectric constant of about 4.0 or greater. All dielectric constants mentioned herein are relative to a vacuum unless otherwise noted. In one embodiment, the gate dielectric comprises a high k material. The term "high k" denotes a dielectric having a dielectric constant of greater than 4.0, preferably greater than 7.0. Specifically, the gate dielectric employed in the present invention includes, but is not limited to: an oxide, nitride, oxynitride and/or silicate including metal silicates and nitrided metal silicates. In one embodiment, it is preferred that the gate dielectric is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof.

The gate conductor is comprised of a conductive material, including, for example, polySi, SiGe, a metal, a metal alloy, a metal silicide, a metal nitride, a metal carbide or combinations including multilayers thereof. When multilayers are present, a diffusion barrier (not shown), such as TiN or TaN, can be positioned between each of the conductive layers. A dielectric capping layer (also not shown), such as an oxide, or nitride, can be located atop the gate conductor (i.e., gate electrode); the presence of the capping layer can be used to prevent subsequent formation of a silicide contact on said gate electrode. The silicide contact on the gate electrode is typically formed when the gate electrode includes a Si-containing material and no capping layer is present.

It is noted that each of the field effect transistors also include source/drain regions, which are located in the semiconductor substrate 12. The source/drain regions separate the channel region of the device. The channel region lies beneath the gate dielectric/gate conductor material stack. For clarity, the source/drain regions and the channel region of the field effect transistor 14 are not illustrated in the drawings of the present application.

The field effect transistor 14 may also include at least one spacer which is located on sidewalls of the gate dielectric/gate conductor material stack. The at least one spacer is comprised of an insulating material including, for example, oxides, nitrides, and oxynitrides. Typically, the at least one spacer is comprised of silicon oxide or silicon nitride.

The field effect transistor, at least one spacer, and source/drain regions are formed utilizing conventional processing techniques that are well known to those skilled in the art. For example, the field effect transistor may be formed by deposition of various material layers, and patterning via lithography and etching. Alternatively, the field effect transistor can be formed by a replacement gate process. The source/drain regions are formed by conventional ion implantation and activation annealing, while the at least one spacer is formed by deposition and etching.

Silicide contact regions 16A, 16B, and optionally 16C are comprised of a metal silicide having a metal component which includes, for example, Ni, Ti, Co, Pt, Ta, W, Pt, Pd and other like materials. Typically, Ni silicide contacts are formed. In some embodiments, the silicide contact regions may also include an alloying additive including, but not limited to: Pt, Pd, Re, W or combinations thereof. The silicide contact regions are formed utilizing a conventional silicidation process that is well known to those skilled in the art. This includes, for example, forming a metal layer atop a Si-containing layer (the Si-containing layer may be the substrate itself or a separate layer disposed atop a non-Si-containing substrate), optionally forming a capping layer such as TaN, first annealing to form a silicide, selective etching any non-reacted metal including the capping layer if used and, if needed, optionally performing a second annealing step. The first anneal step used in forming the silicide contact regions is typically performed at a lower temperature than the second annealing temperature. Typically, the first anneal step is performed at a temperature from about 350° C. to about 600° C., and the second annealing step is performed at a temperature from about 600° C. to about 800° C.

After forming the silicide contact regions, the insulating interlayer 18 including the contact openings 20 are formed. The insulating interlayer 18 comprises any conventional dielectric material. The dielectric material may be porous or non-porous. Some examples of dielectric materials that can be used as the insulating interlayer 18 include, but are not limited to: $SiO_2$, a doped or undoped silicate glass, C doped oxides (i.e., organosilicates) that include atoms of Si, C and H, thermosetting polyarylene ethers, silicon nitride, silicon oxynitride or any combination, including multilayers thereof. In some embodiments, it is preferred to use $SiO_2$ as the insulating interlayer that is formed from a TEOS precursor. Any conventional deposition process can be used in forming the insulating interlayer 18.

The contact openings 20 (which may also be referred to as vias) are formed by lithography and etching. Typically, a reactive ion etching process is used in forming the contact openings.

Next, and as shown in FIG. 1B, a diffusion barrier 22 is typically, but not necessarily, formed by a conventional conformal deposition process such as, for example, physical vapor deposition (PVD) or chemical vapor deposition. The diffusion barrier 22 prevents interaction between the surrounding insulating interlayer 18 and the metal germanide-containing contact material (to be subsequently formed). It is again emphasized that in this embodiment of the present invention, the diffusion barrier 22 is selected to form low Schottky barriers to both the silicide contact regions and the metal germanide-containing material, while blocking any interdiffusion between those regions. The diffusion barrier 22 thus can be comprised of, but not limited to: TaN, TiN, W, Ru or combinations thereof.

The thickness of the diffusion barrier 22, which is formed on exposed surfaces of the insulating interlayer 18 including wall portions within the contact openings 20, may vary depending on the technique used in forming the same, the material of the diffusion barrier itself, as well as the number of material layers within the diffusion barrier. Typically, the diffusion barrier 22 has a thickness from about 6 nm to about 12 nm.

FIG. 1B also show the structure after the metal germanide-containing contact material 24 is formed within each of the contact openings 20. As stated above, the metal component of the contact material can be tailored to minimize the contact resistance to the adjacent materials. The metal component of the contact material may comprise the same or different metal as that present in the silicide contact regions. Typically, the metal component of the inventive contact material is one of W, Cu and Ni. The germanide-containing component of the contact material may comprise pure Ge or SiGe.

The metal germanide-containing contact material 24 is formed by depositing, in any order, a metal layer and a Ge-containing layer (i.e., pure Ge or a SiGe alloy). The deposition can be accomplished either through a sequence of alternating layers of metal and Ge-containing material, or by co-sputtering. The ratio of the volume fractions of metal to Ge-containing material is selected to match the stoichiometry of the desired germanide phase. For example, $Cu_3Ge$ would involve 3 times as much volume Cu as Ge.

After deposition of the materials used in forming the metal germanide-containing contact material, the structure is annealed to form a single-phase via metal germanide-containing contact material 24, after which the structure is planarized to remove germanide overburden, i.e., material grown outside of the contact openings 20.

The annealing step used in forming the inventive metal germanide-containing contact material 24 is performed at a lower temperature than that used in forming the suicide contact regions. Specifically, the annealing steps used in forming the inventive contact material 24 is performed at a temperature of about 400° C. or less, with a temperature from about 200° to about 300° C. being more typical. The annealing step is carried out in a gas atmosphere, e.g., He, Ar, $N_2$ or forming gas.

A conventional planarization process such as, for example, chemical-mechanical polishing (CMP), is used to remove the overburden material that extends outside the contact openings 20 so that the resulting structure, as depicted in FIG. 1B, possesses metal germanide-containing contact materials 24 flush with the diffusion barrier 22 on the top surface of the insulating interlayer 18.

In an alternate embodiment, the top portion of the diffusion barrier 22 located on the insulating interlayer 18 can also be removed by CMP, and a new diffusion barrier (not shown) can deposited over the entire structure, including the metal germanide-containing contact material 24. In this manner, the metal germanide-containing contact material 24 is fully enclosed by diffusion barrier material to prevent any reaction with the overlying metallization, which consists of a low-conductivity metal such as Cu, Al or Ag.

In another alternate embodiment, the structure can be doped with an atomic species, either before or after CMP planarization, so that the region near the top interface of the contact material 24 contains a sufficient concentration of secondary material to lower the Schottky barrier to the overlying metallization. The choice of dopant will depend on the composition of both the contact material 24 and the overlying metallization level, but may consist of Al, Mo, W, Ni, Cr, Cu, Hf, Ta or Ti.

The same procedure may be employed at the contact opening 20 bottom, before, during or after deposition of the metal and Ge-containing materials, to modify the Schottky barrier between the metal germanide-containing contact material 24 and the underlying diffusion barrier 22.

Figure 2:
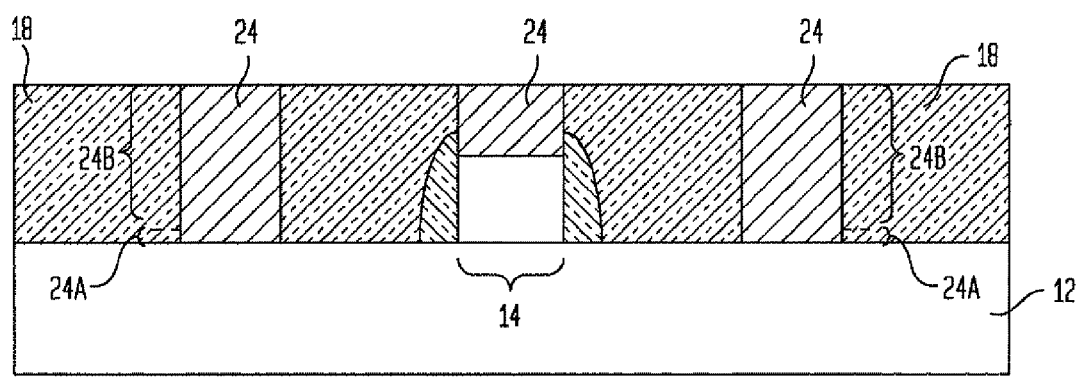
FIG. 2 is a pictorial representation (through a cross sectional view) illustrating a structure that is formed utilizing an alternative embodiment of the present application.

In an alternate embodiment, the metal germanide-containing contact material 24 can be formed directly on the source, drain and gate surfaces, as shown in FIG. 2. Metal and Ge-containing material are deposited, either through PVD or CVD-based methods, into the contact openings 20 that are not lined with a diffusion barrier, and subsequently annealed to form the desired germanide material. This embodiment of the present invention, which is illustrated in FIG. 2, provides a continuous metal germanide-containing material within the contact opening 20 having a lower portion 24A and an upper portion 24B. The lower portion serves as the contact to the source/drain and optionally the gate regions, while the upper portion serves as a contact to overlying metallization. In this manner, several interfaces near the contact opening bottom are removed, decreasing the overall contact resistance from this region. The choice of via metal component of the contact material 24 can consist of, but is not limited to: Ni, Cu or W. A diffusion barrier may be deposited above the contact opening to prevent diffusion of the contact material 24 with the overlying metallization.

In another alternate embodiment, the structure can be doped with an atomic species at the contact opening 20 bottom, before, during or after deposition of the metal and Ge-containing materials, to modify the Schottky barrier between the metal germanide-containing contact material 24 and the underlying source/drain regions. The choice of dopant will depend on the composition of both the contact material 24B and the doping of the source/drain regions, but may consist of Er or Yb for n-type doped source/drain regions and Pt or Ir for p-type doped source/drain regions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    a semiconductor substrate including at least one field effect transistor disposed thereon, said semiconductor substrate including silicide contact regions located adjacent said at least one field effect transistor;
    an insulating interlayer located on said semiconductor substrate and extending atop said at least one field effect transistor, said insulating interlayer having contact openings exposing said silicide contact regions;
    a metal germanide-containing contact material within said contact openings; and
    a diffusion barrier located on at least wall portions of said contact openings, said diffusion barrier separates said metal germanide-containing contact material from said silicide contact regions, wherein a region near bottom portions of each contact opening includes atomic species to minimize the Schottky barrier height at the contact opening/diffusion barrier interface.

2. A semiconductor structure comprising:
    a semiconductor substrate including at least one field effect transistor disposed thereon, said semiconductor substrate including silicide contact regions located adjacent said at least one field effect transistor;
    an insulating interlayer located on said semiconductor substrate and extending atop said at least one field effect transistor, said insulating interlayer having contact openings exposing said silicide contact regions;
    a metal germanide-containing contact material within said contact openings; and
    a diffusion barrier located on at least wall portions of said contact openings, said diffusion barrier separates said metal gennanide-containing contact material from said silicide contact regions, wherein a region near a top portion of each contact opening includes atomic species to minimize the Schottky barrier height at the contact opening/diffusion barrier interface.

3. The semiconductor structure of claim 1 wherein said metal germanide-containing contact comprises a metal germanide alloy or a metal silicon germanide alloy.

4. The semiconductor structure of claim 3 wherein said metal is one of W, Cu, and Ni.

5. The semiconductor structure of claim 2 wherein said metal germanide-containing contact comprises a metal germanide alloy or a metal silicon germanide alloy.

6. The semiconductor structure of claim 5 wherein said metal is one of W, Cu, and Ni.

* * * * *